United States Patent [19]

Kim et al.

[11] Patent Number: 4,814,291

[45] Date of Patent: Mar. 21, 1989

[54] METHOD OF MAKING DEVICES HAVING THIN DIELECTRIC LAYERS

[75] Inventors: Sea-Chung Kim, South Whitehall Township, Lehigh County; Alvaro Maury, Wescosville; William H. Stinebaugh, Jr., Bethlehem, all of Pa.

[73] Assignee: American Telephone and Telegraph Company, AT&T Bell Laboratories, Murray Hill, N.J.

[21] Appl. No.: 833,884

[22] Filed: Feb. 25, 1986

[51] Int. Cl.$^4$ ............................................. H01L 21/70
[52] U.S. Cl. ..................................... 437/101; 437/48; 437/52; 437/40; 437/43; 437/193; 437/233; 437/919
[58] Field of Search ................. 357/2, 23.6; 148/DIG. 1, 1.5, DIG. 118; 427/93; 29/571, 576 E, 577 C; 927/253.3

[56] References Cited

U.S. PATENT DOCUMENTS

| | | | |
|---|---|---|---|
| 4,062,747 | 12/1977 | Chang et al. | |
| 4,229,232 | 10/1980 | Kirkpatrik | 148/1.5 |
| 4,300,989 | 11/1981 | Chang . | |
| 4,441,249 | 4/1984 | Alspector et al. | |
| 4,460,417 | 7/1984 | Murase et al. | 148/187 |
| 4,494,301 | 1/1985 | Faraone | 29/571 |
| 4,544,418 | 10/1985 | Gibbons . | |
| 4,566,913 | 1/1986 | Brodsky et al. | 148/1.5 |
| 4,585,492 | 4/1986 | Wienberg et al. | 148/1.5 |
| 4,604,304 | 8/1986 | Faraone | 427/255 |

FOREIGN PATENT DOCUMENTS 2131407  6/1984  United Kingdom .

OTHER PUBLICATIONS

Kato et al., "Rapid Annealing Using Halogen Lamps", *J. Electrochem. Soc.*, vol. 131, No. 5, pp. 1145–1152 (May, 1984).

"Journal of the Electrochemical Society", vol. 133, No. 2, Feb. 1986 (Manchester, US), C. Y. Lu et al.: Thermal Oxidation of Undoped LPCVD Polycrystalline Silicon Films, pp. 446–447.

"Proceedings of the IEEE International Conference on Circuits and Computers ICCC '80", Oct. 1–3, 1980, IEEE (New York, US), N. Tsubouch et al.: The Application of High Pressure Oxidation Process to Fabrication of MOS LSI, pp. 461–464.

"IEEE Transactions on Electron Devices", vol. ED-32, No. 3, Mar. 1985 (New York, US), L. Faraone et al.: Characterization of Thermally Oxidized n+ Polycrystalline Silicon, pp. 577–583.

"Proceedings of the International Electron Devices Meeting", Dec. 1–4 1985, IEEE (New York, US), T. Warabisako et al.: A 600° C. Process for MOSFET Fabrication Using Microwave Plasma-Stream Gate Oxidation, see pp. 216–219.

"Proceedings of the International Electron Devices Meeting", Dec. 1–4 1985, IEEE (New York, US), T. Ono et al.: Studies of Thin Poly Si Oxides for E and $E^2$ PROM, see pp. 380–383.

"Extended Abstracts of the Journal of the Electrochemical Society", vol. 81-1, May 1981, S. K. Lai: Very Thin Gate Insulators, see p. 541.

Nulman et al., Rapid Thermal Processing of Thin Gate Dielectrics. Oxidation of Silicon, IEEE Electron Device Letters, May 1985.

Pulse, "Rapid Thermal Processing Technology 1985", vol. 3, No. 3, Thin Gate Dielectrics, Jul. 1985.

Nulman et al., Electrical Characteristics of Thin Gate Implanted MOS Channels Grown by Rapid Thermal Processing, IEDM 85, pp. 376–379.

New Model of the Rapid Initial Oxidation of Silicon, S. A. Schafer and S. A. Lyon, Princeton University, Princeton.

Properties of Thermal Oxides Grown on Phosphorus in Situ Doped Polysilicon, M. Sternheim et al., Ta/Si Interface, vol. 130, #8.

*Primary Examiner*—Brian E. Hearn
*Assistant Examiner*—Tom Thomas
*Attorney, Agent, or Firm*—James H. Fox

[57] ABSTRACT

Certain devices require a high quality thin (<25 nanometer) dielectric layer formed on a deposited silicon layer. Applications include capacitor dielectrics in dynamic memories and linear devices. In another application, an electrically erasable programmable read only memory (EEPROM) uses an $SiO_2$ layer between the write gate and the floating gate. The present technique oxidizes amorphous silicon under conditions that suppress grain growth to produce a higher quality oxide than that achieved with conventional furnace oxidation of polysilicon. Rapid thermal oxidation is one method of practicing the technique.

12 Claims, No Drawings

METHOD OF MAKING DEVICES HAVING THIN DIELECTRIC LAYERS

BACKGROUND OF THE INVENTION

1. Field of the Invention

The present invention relates to solid state devices that utilize a thin layer of silicon dioxide as a dielectric.

2. Description of the Prior Art

Numerous applications exist in the semiconductor art for thin layers (i.e., <25 nanometers) of silicon dioxide grown on deposited silicon. For example, in a switched-capacitor filter or a dynamic random access memory, a capacitor dielectric may be formed by first depositing a layer of polycrystalline silicon ("polysilicon", or "poly"), which is doped with an impurity to form a first conductive plate of the capacitor. Depending on the doping and deposition conditions, polysilicon as deposited comprises grains of single-crystal silicon having a grain size (diameter) of typically from about 50 to 200 nanometers. The doped polysilicon is then heated in an oxygen ambient for a period of about one-half hour, in order to oxidize the surface, thereby forming a dielectric layer of $SiO_2$. An additional layer of doped polysilicon may then be deposited on the $SiO_2$ dielectric layer, in order to form the second capacitor plate. Prior to forming this second plate, a silicon nitride layer may optionally be formed by growth or deposition on the silicon dioxide layer, producing a "dual dielectric" capacitor. In a dynamic memory, the capacitor may extend over the adjoining access transistor in the "stacked capacitor" structure, or may be located in a trench alongside the access transistor, with other configurations being possible. The elevated temperature of the oxidizing process, and subsequent heat treatments involved in the other process steps, typically cause the polysilicon grain sizes (in the unoxidized portions) to increase to perhaps 100 to 1000 nanometers.

A very important criterion of the quality of the dielectric layer is its breakdown voltage for a given dielectric thickness. That is, it is desirable to use as thin a dielectric as possible, in order to maximize the capacitance per unit area, while obtaining the required breakdown voltage to operate without failure. It is generally known in the art that the breakdown voltage of oxidized polysilicon is less than the breakdown voltage of oxidized single-crystal silicon of comparable thickness. Therefore, a thicker layer of $SiO_2$ is used when it is formed from polysilicon, as when formed from single-crystal silicon (e.g., a substrate), to obtain a comparable breakdown voltage. It is known that furnace oxidation of in-situ doped polysilicon deposited at 600 degrees C. produces a higher breakdown voltage than when deposited at 640 degrees C.; see "Properties of Thermal Oxides Grown on Phosphorus in-situ Doped Polysilicon", M. Steinheim et al, *Journal of the Electrochemical Society*, Vol. 130, pp. 1735-1740 (1983). In addition, it is known that silicon tends to deposit in the amorphous state at deposition temperatures below about 590 degrees C. It has been proposed to deposit silicon in the amorphous state, and then oxidize it; see "Characterization of Thermally Oxidized n+ Polycrystalline Silicon", L. Faraone et al, *IEEE Transactions on Electron Devices*, Vol. ED-32, pp. 577-583 (1985). However, the doping techniques utilized therein resulted in at least a surface portion of the silicon converting to the polycrystalline state prior to, or during, oxidation.

Another application of $SiO_2$ layers grown on deposited polysilicon is for the top dielectric of the "floating gate" in electrically erasable programmable read-only-memories (EEPROMs); see, for example, U.S. Pat. No. 4,544,418. That patent also discloses rapidly oxidizing the (single crystal) substrate in order to form the thin gate oxide layer of such a device. In general, it is also desirable to be able to form the top dielectric from as thin an oxide as possible, to minimize the voltage required to write data into the device. It is also known to use oxidized polysilicon as the gate dielectric of an insulated gate field effect transistor. In that case also, smaller device geometries require thinner gate oxides that still obtain a satisfactory breakdown voltage.

SUMMARY OF THE INVENTION

We have invented a technique for forming a thin silicon dioxide layer wherein amorphous silicon is oxidized under conditions that maintain at least a surface portion of the silicon amorphous as it is undergoing oxidation to form silicon dioxide. The amorphous silicon is typically formed by chemical vapor deposition at a sufficiently low temperature to ensure the amorphicity of the silicon as deposited. A conductivity-enhancing dopant, at a concentration of typically at least one weight percent, may be optionally included in the deposited material, preferably by co-deposition with the amorphous silicon.

DETAILED DESCRIPTION

The following detailed description relates to an improved technique for growing silicon dioxide layers on deposited silicon. The inventive technique results from our discovery that grown $SiO_2$ layers of improved dielectric quality are obtained when the deposited silicon is amorphous, and the oxidation of the amorphous silicon is rapidly accomplished, or otherwise accomplished to prevent conversion of at least a surface portion of the amorphous silicon to polysilicon. Application of the present technique to the production of integrated circuits and other solid state devices is possible. Silicon is considered to be amorphous when only short-range order is present at the atomic level, with any resulting grains having a size of less than 1 nanometer, as determined by x-ray or electron diffraction techniques known in the art. The effectiveness of the foregoing combination of conditions is illustrated by means of the following Examples.

EXAMPLE I

In a first series of experiments, the breakdown voltage of oxidized polysilicon having various doping levels was determined. For this purpose, 400 nanometers of undoped polysilicon was deposited on a 100 nanometer thick layer of $SiO_2$ that had been grown on each of six silicon wafers, each 5 inches in diameter. The polysilicon was deposited by a low pressure chemical vapor deposition (CVD) reaction of $SiH_4$ at a temperature in the range of 580 to 590 degrees C., and was in a semi-amorphous state as deposited. Two of the wafers were then exposed to $PBr_3$ gas at a temperature of 950 degrees C. for 10 minutes, resulting in a doping of the polysilicon with 1.5 weight percent of phosphorus. Two other wafers were similarly exposed for 20 minutes, producing a 2 weight percent phosphorus doping, and the last two wafers were exposed for 30 minutes, producing a 2.2 weight percent doping. In all cases, the exposure to the elevated temperatures during doping caused the silicon to convert to the polycrystalline state.

Three of the wafers, one at each doping level, were furnace oxidized in an atmosphere of 10% $O_2$, 90% Ar, and 0.1% $C_2H_3Cl_3$ at 950 degrees C. for a period of 18 minutes, producing a $SiO_2$ layer about 17 nanometers thick on the surface of the polysilicon layer on each wafer. Another three of the wafers, one at each doping level, were rapidly oxidized by exposure to $O_2$ for 85 seconds at a temperature of 1000 degrees C., which was produced by a tungsten-halogen flashlamp. This produced a layer of $SiO_2$ about 20 nanometers thick on the polysilicon surface of each wafer. A second layer of polysilicon 340 nanometers thick, and doped with about 1 weight percent phosphorus, was deposited on the foregoing 20 nanometer grown $SiO_2$ layer on each of the six wafers. This second polysilicon layer was patterned to form electrodes, and an electric voltage applied to each of the polysilicon layers, thereby producing an electric field across the 20 nanometer grown $SiO_2$ layer.

The breakdown voltage, and hence breakdown field, was determined for each grown $SiO_2$ layer of each wafer; the results are presented in Table 1. Note that the breakdown field did not exceed 5.5 megavolts per centimeter of film thickness, and decreased significantly at the highest dopant concentration.

| Breakdown Field for Oxidized Polysilicon | | |
|---|---|---|
| | Breakdown field (MV/cm) | |
| Phosphorus concentration (weight percent) | Furnace Oxidation | Rapid Oxidation |
| 1.5 | 5.4 | 4.0 |
| 2.0 | 5.5 | 5.4 |
| 2.2 | 1.7 | 1.4 |

EXAMPLE II

This Example illustrates the improved dielectric films made according to one embodiment of the inventive technique. Four silicon wafers had formed thereon a 100 nanometer thick layer of silicon dioxide. Deposited on the oxide layer of each wafer was 400 nanometers of amorphous silicon that was in-situ doped with phosphorus by co-deposition of the silicon and phosphorus. The deposition was accomplished by low pressure chemical vapor deposition, using $SiH_4$ and $PH_3$ as the source gases, and a small amount of $N_2$ to reduce the formation of large particles. (The use of other source gases is possible.) The deposition temperature of 570 degrees C. was low enough to ensure the amorphous state of the silicon as deposited. (Chemical vapor deposition temperatures below about 580 to 590 degrees C. typically results in amorphous silicon.) The deposition rate, of a pressure of 1 Torr (1 mm of $H_g$), was 6.5 nanometers/minute. This allowed a relatively short deposition period, which prevented recrystallization of the amorphous silicon at the bottom of the film. A first two of the wafers were doped with 1.5 weight percent phosphorus, and a second two were doped with 2.4 weight percent phosphorus, by this procedure. The deposited silicon was maintained in the amorphous state following deposition.

The deposited amorphous silicon on two of the wafers, one at each doping level, was furnace oxidized as above, producing oxide thicknesses averaging about 19 nanometers. The deposited amorphous silicon on the remaining two of the wafers, one at each doping level, was rapidly oxidized as above, producing oxide thicknesses averaging about 23 nanometers. Each wafer then had a doped polysilicon top layer deposited on the grown oxide layer, and patterned to serve as an electrode as above.

The resulting breakdown fields were determined as above, and the results are shown in Table 2.

| Breakdown Field for Oxidized Amorphous Silicon | | |
|---|---|---|
| | Breakdown Field (MV/cm) | |
| Phosphorus concentration (weight percent) | Furnace Oxidation | Rapid Oxidation |
| 1.5 | 6.6 | 8.5 |
| 2.5 | 5.8 | 8.8 |

It can be seen that the combination of rapid oxidation and amorphous silicon results in an oxide having significantly improved quality as compared to silicon dioxide films produced by the prior art technique of furnace oxidation of polysilicon, and is also superior to both rapid oxidation of polysilicon and furnace oxidation of amorphous silicon. This is due to improved surface smoothness of the rapidly oxidized amorphous silicon. Note that the improvement is especially significant at relatively high dopant concentrations; i.e., above about 2 weight percent for phosphorus as the dopant. The deposited amorphous silicon layer may be oxidized through its entire thickness by the present technique, or alternately only a surface portion may be oxidized. During the above rapid oxidation process, the amorphous silicon material underlying the surface portion became polycrystalline. If the surface portion is sufficiently oxidized before grain growth of the silicon material occurs, the improved dielectric properties are obtained largely independently of subsequent grain growth in the underlying material. Transmission electron microscope pictures of the underlying silicon show that the resulting silicon grains are much more uniform when the surface of amorphous silicon is rapidly oxidized as compared to the case when the surface of polysilicon is oxidized under either of the foregoing rapid or furnace oxidation conditions. Note also that even though it is known that higher temperatures tend to promote grain growth, the "rapid oxidation" (at 1000 degrees C.) was so much shorter in duration than the "furnace oxidation" (at 950 degrees C.) in this Example that improved dielectric quality was obtained. This is due to the rapidly oxidized surface forming a $SiO_2$ "cap" that maintained surface smoothness even as some grain growth in the underlying silicon occurred.

In general, "rapid oxidation" as used herein means performing the oxidation in less than 5 minutes, as may be accomplished in a flashlamp heater apparatus. In accomplishing the rapid oxidation, the temperature ramp-up should provide for a heating rate that makes the transition from a relatively low temperature (e.g., 600 degrees C.) to an oxidizing temperature in excess of 950 degrees C., in less than 5 minutes. A typical radiant heater (e.g., flashlamp) produces this transition in less than 1 minute, and typically only a few seconds, even when starting from room temperature. This rapid transition helps avoid significant polysilicon grain growth prior to forming the oxide "cap". The time at maximum temperature is also less than 5 minutes, and in a typical case less than 2 minutes. The ramp-down of the temperature may then be relatively long if desired, since the oxide "cap" will have formed, and will maintain surface smoothness even if some further polysilicon grain growth occurs during ramp-down, or in subsequent heating steps. The maximum temperature is typically in excess of 950 degrees C. for a dry oxygen ambient at atmospheric pressure. However, the use of a steam oxidizing ambient and/or increased pressure may be used to reduce the maximum temperature required. The addition of other oxidizing agents (e.g., chlorine or fluorine) may also reduce the times or temperatures required. A plasma atmosphere comprising oxygen may be used to assist the oxidation process; see, e.g., U.S. Pat. Nos. 4,062,747 and 4,300,989 co-assigned herewith. These techniques may thus be used to reduce the oxidation temperature sufficiently so that polysilicon grain formation (from the amorphous silicon) is retarded until after the surface portion is oxidized. The oxidation times may then be longer than those used for "rapid oxidation", and still achieve improved dielectric quality as compared to oxidation of polysilicon. For example, plasma assisted oxidation of silicon at temperatures below 600 degrees C. is known in the art. As applied to the present technique, the use of a relatively low oxidizing temperature provides for reducing (or even eliminating) the rate of polysilicon grain formation and growth, while still allowing oxidation of the amorphous silicon to a usable thickness (e.g., greater than 5 nanometers).

Although deposition of amorphous silicon has been illustrated above, the amorphous silicon may be formed by other techniques. For example, a layer of deposited polysilicon may be rendered amorphous by ion beam damage. The ion species may be, for example, an inert gas (e.g., argon), or a dopant used to enhance the conductivity of the silicon. However, in some cases, only a surface portion of the polysilicon need be amorphized thereby, for the reasons noted above. We recommend that the amorphous surface portion be at least 10 nanometers thick prior to the oxidizing, to help ensure the benefits noted herein. The oxidizing typically proceeds to produce a thickness of the silicon dioxide of at least 3 nanometers. The oxidizing typically is terminated before oxidizing the entire thickness of the deposited silicon, but the entire thickness may be oxidized if desired. If the oxidizing is accomplished at a sufficiently low temperature (e.g., less than about 580 degrees C.), than the entire thickness of the silicon layer can remain amorphous during the oxidation process, assuming it was in that state prior to oxidation. Exposure to higher temperature (e.g., greater than about 590 degrees C.) during subsequent processing operations may then cause polysilicon grain formation in the silicon underneath the oxidized surface region. For reasons as noted above, the oxidized surface "cap" results in improved surface smoothness, and increased electric breakdown field, in that case also.

It can be seen from the above Examples that the present techniques produces an oxide layer having an electric breakdown field of typically over 8 megavolts per centimeter. In a typical case, it appears that the electric breakdown field of $SiO_2$ formed by the inventive technique is at least 10 percent greater than for an equally thick layer of $SiO_2$ grown on polysilicon, under comparable oxidizing conditions (e.g., the same times, temperatures, and oxidizing ambient). Other operations known in the art (e.g., growing or depositing silicon nitride on the silicon dioxide) may be used to further improve various properties of the layer formed by the present technique.

What is claimed is:

1. A method of making a solid state device by steps comprising depositing a layer of silicon and oxidizing a portion of said layer, characterized in that
said layer is amorphous silicon including at least 1 weight percent phosphorus, and said oxidizing is accomplished by continually increasing the temperature of the amorphous silicon from less than 600 degrees C. to at least 950 degrees C. in an ambient comprising oxygen during a time period of less than 1 minute to oxidize a surface portion of said layer before the underlying portion of said amorphous silicon is significantly converted to polysilicon, and maintaining said temperature at a maximum value for less than 5 minutes, whereby a smooth layer of silicon dioxide having a thickness of less than 25 nanometers and having an increased electric breakdown field is grown, wherein the underlying portion of said layer of silicon is converted to polysilicon.

2. The method of claim 1 wherein said amorphous silicon is in the amorphous state as deposited at a temperature of less than 580 degrees C.

3. The method of claim 1 wherein said amorphous silicon is formed by ion-beam damage of deposited polycrystalline silicon.

4. The method of claim 1 wherein said conductivity-enhancing dopant is co-deposited with said layer of amorphous silicon.

5. The method of claim 1 wherein said amorphous silicon includes at least 2 weight percent of a conductivity-enhancing dopant.

6. The method of claim 1 wherein said layer as oxidized by said oxidizing comprises a dielectric layer of a capacitor.

7. The method of claim 1 wherein said layer as oxidized by said oxidizing comprising a gate dielectric of an insulated gate field effect transistor.

8. The method of claim 1 wherein said heating maintains said layer at a maximum temperature in excess of 950 degrees C. for a time of less than 2 minutes.

9. The method of claim 1 wherein the oxidized portion of said layer has a thickness of at least 3 nanometers.

10. The method of claim 1 wherein the electric breakdown field of said layer of silicon dioxide is at least 8 megavolts per centimeter.

11. The method of claim 1 wherein the electric breakdown field of said layer of silicon dioxide is at least 10 percent greater than the electric breakdown field of a layer of silicon dioxide of the same thickness grown on polysilicon under comparable oxidizing conditions.

12. The method of claim 1 wherein said step of continually increasing the temperature of the amorphous silicon is accomplished by means of a flashlamp.

* * * * *